United States Patent [19]

Berst et al.

[11] Patent Number: 5,604,349

[45] Date of Patent: Feb. 18, 1997

[54] CAPSULE FOR A DETECTOR OPERATING IN AN ULTRA-HIGH VACUUM

[75] Inventors: Marc Berst, Schiltigheim, France; Jürgen Eberth, Köln, Germany; Herbert M. Jäger, Aachen, Germany; Hans Kämmerling, Eschweiler, Germany; Rainer M. Lieder, Jülich, Germany; Walter Renftle, Düren, Germany

[73] Assignees: Eurisys Mesures, Tanneries, France; Forschungszentrum Jülich GmbH, Jülich, Germany; Universilata, Köln, Germany

[21] Appl. No.: 589,365

[22] Filed: Jan. 22, 1996

Related U.S. Application Data

[63] Continuation-in-part of PCT/DE94/00844 filed Jul. 19, 1994.

[30] Foreign Application Priority Data

Jul. 23, 1993 [DE] Germany .................. 43 24 709.1

[51] Int. Cl.⁶ .................................................. G12B 15/00
[52] U.S. Cl. .................................................. 250/370.15
[58] Field of Search ........................... 250/370.15, 261

[56] References Cited

U.S. PATENT DOCUMENTS

| | | | |
|---|---|---|---|
| 3,055,101 | 9/1962 | Bergan | 29/455.1 |
| 3,609,992 | 10/1971 | Cacheux | 62/51.1 |
| 5,012,102 | 4/1991 | Gowlett | 250/352 |
| 5,420,419 | 5/1995 | Wood | 250/338.4 |

OTHER PUBLICATIONS

Patent Abstracts of Japan, vol.17, No. 522(p. 1616 20. Sep. 1993.

Nuclear Instruments and Methods, vol. 69, 1969, Amsterdam, NL, pp. MIT 293–302, Büker H. "Ein hochauflösendes gamma spectrometer mit einem Bohrloch–Germanium–dectector".

*Primary Examiner*—Constantine Hannaher
*Attorney, Agent, or Firm*—Klaus J. Bach

[57] ABSTRACT

In a capsule for a detector operating in an ultra high vacuum suitable as a gamma radiation spectrometer, there is provided a detector chamber in which the detector is mounted and a getter chamber in which a getter element is mounted and the getter chamber is separated from the detector chamber by a thermal protection structure to prevent heating of the detector when the getter element is heated for conditioning. The getter element serves to maintain an ultra high vacuum in the detector chamber over a long period of operation.

5 Claims, 1 Drawing Sheet

CAPSULE FOR A DETECTOR OPERATING IN AN ULTRA-HIGH VACUUM

This is a continuation-in-part application of the international patent application PCT/DE94/00844 filed on Jul. 19, 1994 and claiming the priority of the German patent application P 43 24 709.1 filed on Jul. 23, 1993.

BACKGROUND OF THE INVENTION

The invention relates to a capsule for a detector operating in an ultra-high vacuum which is suitable as gamma (γ) spectrometer, particularly for a germanium (Ge) detector.

For the spectroscopy of γ-radiation in many areas of research and in industry, detectors of high purity germanium (HPGe) are utilized. These detectors have very good energy Resolution and a high detection efficiency, properties which facilitate a general application in basic nuclear physics research and in space research but also environmental monitoring, radiation protection, non-destructive material analysis and industrial manufacture monitoring.

In order to become operative, Ge-detectors need to be cooled down to about −190° C. by liquid nitrogen. For this purpose the detectors are installed in a vacuum cryostat which, at the same time, protects the very sensitive surfaces of the detectors. The present cryostat technology makes handling and service of the detectors difficult. It also makes it hard to use the same detector for different measuring tasks.

Detectors which are used as γ-spectrometers and are mounted in capsules are utilized for example for the detection of γ-radiation emitted from fast moving atomic nuclei.

In order to limit the energy broadening of the γ-lines caused by inherent Doppler effects, it is desirable to provide an as small as possible solid angle for the detectors and the detectors should have a high granularity. In the interactions between γ-rays and detector materials, scattering effects occur in addition to the desired photo effect to be detected, particularly the so-called Compton scattering, which provides for a continuous background in the γ-ray spectrum and which deteriorates the detector response function. To minimize this Compton background, the detector is made as large in volume as possible. In addition, an anti-Compton detector is utilized by which the Compton-scattered γ-radiation escaping from the detector can be detected and suppressed.

By arranging the detectors in evacuated capsules, a high reliability of the detectors during experiments can be achieved. The highly sensitive surfaces of the detector crystals are protected by the ultra high vacuum in the chamber. In this way, the handling of the detectors becomes quite simple, particularly during regeneration after radiation damage. Encapsulated detectors can also be advantageously arranged in clusters comprising several detectors so that, by adding the energies deposited in the various detectors in case of Compton scattering, the total energy of a γ-quantum can be determined with high accuracy.

In order to maintain the sensitivity of the detector crystals over long periods of operation, the ultra high vacuum in the detector chamber must be-kept as constant as possible.

It is the object of the present invention to provide a capsule for a detector with a detector chamber in which an ultra high vacuum can be maintained over a long period of operation.

SUMMARY OF THE INVENTION

In a capsule for a detector operating at ultra high vacuum suitable as a gamma radiation spectrometer, there is provided in a containment pot a detector chamber in which the detector is mounted and a getter chamber in which a getter element is mounted. The getter chamber is separated from the detector chamber by a thermal protection structure to prevent heating of the detector when the getter is heated for conditioning.

Residual gas molecules, especially $H_2$ molecules, are absorbed by the getter and removed from the detector chamber. If the absorption capacity of the getter has been reached, the getter can be regenerated by heating whereby the absorbed gases are evaporated. In order to protect the detector from being damaged during this procedure, the getter element is mounted in a getter chamber which is separated from the detector chamber by a thermal shield. The thermal shield is preferably a getter housing within which the getter element is mounted.

Preferably the getter element is supported by a lid used to close the containment pot in an ultra high vacuum tight manner by electron beam welding. For the evacuation of the detector chamber and the getter chamber, a tube is provided which, after the required ultra high vacuum has been established, is vacuum-sealed by cold welding using the pinch-off technique. It is important in the γ-ray spectroscopy with Ge detectors to use aluminum for all capsule parts.

A preferred embodiment of the invention will now be described in greater detail on the basis of the accompanying drawings.

DESCRIPTION OF A PREFERRED EMBODIMENT

Figures 1, 2:
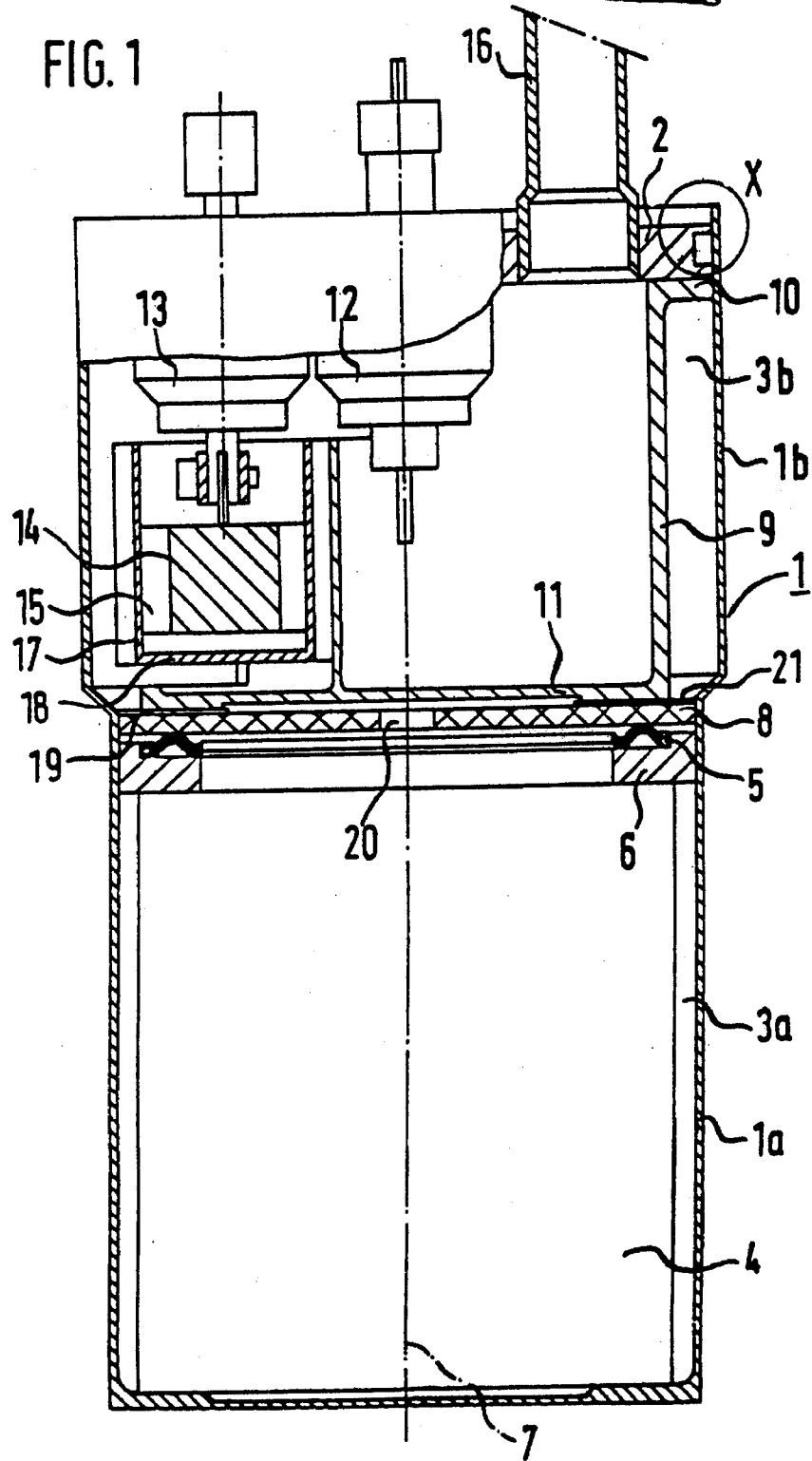
FIG. 1 shows a cross-section of a capsule including a detector.
FIG. 2 is an enlarged view of the structure shown in the circle X of FIG. 1.

The capsule shown in FIG. 1 consists of an aluminum alloy and comprises a containment pot 1 (capsule parts 1a, 1b) and a containment lid 2. The containment pot 1 encloses a detector chamber comprising two detector chamber areas 3a, 3b. The chamber area 3a in the lower part 1a of the containment part 1a contains a detector 4, in the example given here a germanium (Ge) detector, which serves as a γ-ray spectrometer. Besides Ge, Silicon (Si) is a suitable detector material for γ-spectroscopy. Using either material, detectors of high energy resolution can be made.

The detector 4 is firmly mounted in the detector chamber area 3a by means of a dished spring 5. The dished spring 5 is centered by means of a recess in a centering ring 6 so as to be concentric with the axis 7 of the containment pot 1. The centering ring 6 rests, with its front face, on the detector 4 and holds it in position in the detector chamber 3.

The dished spring 5 is held in place by means of a ceramic disc 8 and a pressure ring 9 which is fixed by the lid 2. For this purpose, the pressure ring 9 includes a flange 10 which has an outer edge so dimensioned that the pressure ring 9 is centered when it is inserted into the containment pot 1. The length of the pressure ring 9 defines, in the detector chamber area 3b between the capsule lid 2 and the bottom 11 of the pressure ring, an intermediate chamber which, during electron beam welding of the containment pot and the lid, serves as thermal protection for the detector 4 mounted in the lower part 1a of the containment pot.

FIG. 1 shows schematically penetrations 12, 13 in the lid 2 for connection of the detector to signal transmission and high voltage cables. The penetration 13 in the embodiment shown serves as a current feed-through for a getter element 14 by which the required ultra high vacuum in the detector chamber is maintained by absorption of residual gas molecules by the getter.

In the embodiment as shown in FIG. 1, the getter chamber 15 contains a porous getter which is commercially available under the name St. 172 SAES-getter and which absorbs residual gases by chemosorption or chemical reactions. By way of the getter process, the required ultra high vacuum 5 can be maintained over long periods of operation. If the getter material is exhausted, it can be reactivated by heating.

To permit evacuation of the detector chamber 3 and of the getter chamber 15 during manufacturing, the lid 2 includes a tube 16. The tube 16 consists, like all the capsule components, of aluminum. After achieving the required high vacuum by evacuation of the detector chamber and the getter chamber, the tube is cold-welded in a vacuum-tight manner by a pinch-off technique.

In order to activate the getter, the following procedure is required:

By way of the tube 16, the capsule is connected to a high-vacuum pump. Then the capsule is heated and an ultra high vacuum is generated in the detector chamber and in the getter chamber. Subsequently the getter is activated by heating with an electric heating element which allows to heat the getter to a temperature of 900° C. This temperature is maintained for about 10 minutes. After activation of the getter, the evacuated chamber is sealed. This is done by closing the tube 16 by cold welding (pinch-off technique).

The getter can be re-activated whenever it becomes necessary because the pumping capacity of the getter is exhausted. It is not necessary to remove the getter from the capsule for that purpose.

During the getter activation procedure, the temperature-sensitive detector 4 in the detector chamber area 3a is protected from excessive heating which could destroy the detector. The getter element 14, which can be heated electrically, is mounted in a getter container 17 which is open at one end. The getter container is fixed to the lid 2 in such a way that its closed bottom 18 is pointing toward the detector 4. The getter container therefore surrounds the getter element in such a way that the detector is thermally protected from the getter. Particularly, the detector is protected from thermal radiation. The bottom 18 of the getter container 17 is therefore optically closed so that no thermal radiation can pass therethrough. For the thermal protection of the detector material from undesirable overheating, it is also important that the detector is mounted in the lower area 3a of the detector chamber whereas the getter container 17, by being fixed to the lid 2, is arranged in the upper area 3b of the detector chamber. In addition to the getter container 17, the ceramic disc 8 mounted between the upper and the lower areas 3a, 3b of the detector chamber provides for thermal protection of the detector.

The lower and the upper areas 3a, 3b of the detector chamber are in communication by openings 19,20 in the bottom 11 of the pressure ring 9. The openings 19 in the bottom 11 of the pressure ring 9 are formed between bars 21 with which the pressure ring 9 is seated on the ceramic disc 8.

The lid 2 closing the detector chamber is electron beam welded to the rim 22 of the containment pot. In order to prevent welding vapors, which are generated during electron beam welding, from entering the detector chamber 3, the lid 2 includes an annular groove-like chamber 23 in which the welding vapors can be condensed (see FIG. 2 detail X). If necessary, the capsule can be cooled during electron beam welding.

During electron beam welding the lid 2 together with the getter container 17 including the getter element mounted on the lid is force-fitted into the containment pot against the pressure of the dished spring 5 so that the lid is firmly seated in the containment pot 1. For this purpose, the capsule lid 2 is formed with a conical outer edge 24 whereby the lid 2 can be pressed into the containment pot 1. By this lid design the lid acts also as a vapor barrier during the electron beam welding procedure.

What is claimed is:

1. A capsule for a detector operating in an ultra high vacuum, suitable as a gamma radiation spectrometer, said capsule including a detector chamber containing said detector and a getter chamber containing a heat reactivatable getter element, said getter chamber being separated from said detector chamber by a thermal protection structure.

2. A capsule as claimed in claim 1, wherein said thermal protection structure is a getter container in which said getter element is mounted.

3. A capsule as claimed in claim 1, wherein said capsule includes a containment pot and a lid which is electron-beam welded onto said containment pot so as to be ultra high vacuum tight and said getter element is fixed to said lid.

4. A capsule as claimed in claim 1, wherein said capsule includes a tube through which said detector chamber and said getter chamber can be evacuated, said tube being sealed vacuum tight by a pinch-off technique after the ultra high vacuum in said detector chamber has been established.

5. A capsule as claimed in claim 1, wherein a ceramic disc is arranged between said detector chamber and said getter chamber to provide heat protection for said detector when said getter element is heated for conditioning.

\* \* \* \* \*